(12) United States Patent
Chen et al.

(10) Patent No.: US 9,496,074 B2
(45) Date of Patent: Nov. 15, 2016

(54) LASER ETCHING METHOD FOR TRANSPARENT CONDUCTIVE PLATE AND TRANSPARENT CONDUCTIVE PLATE PREPARED THEREBY

(71) Applicant: NANOBIT TECH. CO., LTD., Taoyuan County (TW)

(72) Inventors: Yao-Zong Chen, Taoyuan County (TW); Yu-Yang Chang, Taoyuan County (TW); Shiou-Ming Liu, Taoyuan County (TW); Chien-Rong Lu, Taoyuan County (TW)

(73) Assignee: NANOBIT TECH. CO., LTD., Taoyuan County (TW)

( * ) Notice: Subject to any disclaimer, the term of this patent is extended or adjusted under 35 U.S.C. 154(b) by 112 days.

(21) Appl. No.: 14/642,299

(22) Filed: Mar. 9, 2015

(65) Prior Publication Data

US 2016/0203888 A1   Jul. 14, 2016

(30) Foreign Application Priority Data

Jan. 9, 2015   (TW) .............................. 104100774 A (51) Int. Cl.
*H01B 13/00* (2006.01)
*B23K 26/36* (2014.01)

(52) U.S. Cl.
CPC ........... *H01B 13/003* (2013.01); *B23K 26/362* (2013.01); *B23K 26/364* (2015.10); *B23K 26/352* (2015.10); *B23K 26/359* (2015.10); *H01B 13/00* (2013.01)

(58) Field of Classification Search
CPC .................. H01B 13/00; H01B 13/003; B23K 26/352; B23K 26/359; B23K 26/362; B23K 26/364
USPC ............ 219/121.69, 121.76, 121.77, 121.85; 264/400; 216/37, 94; 427/554, 555, 427/556; 29/847
See application file for complete search history.

(56) References Cited

U.S. PATENT DOCUMENTS

| | | | | |
|---|---|---|---|---|
| 6,300,594 | B1 * | 10/2001 | Kinoshita | B23K 26/073 219/121.68 |
| 6,576,866 | B1 * | 6/2003 | Karg | G02F 1/0118 219/121.69 |
| 6,635,850 | B2 * | 10/2003 | Amako | B23K 26/067 219/121.69 |
| 6,838,038 | B2 * | 1/2005 | Lovell | B23K 26/38 264/400 |

(Continued)

*Primary Examiner* — Samuel M Heinrich
(74) *Attorney, Agent, or Firm* — Li & Cai Intellectual Property (USA) Office (57) ABSTRACT

A laser etching method for a transparent conductive plate includes the steps as follows: providing a transparent conductive plate having a transparent conductive layer; continuingly emitting a plurality of laser beams to the transparent conductive layer, and controlling the center points of the laser beams to move in a front path and a rear path partially overlapping a beginning portion of the front path for forming an end connection groove connecting the beginning and the end thereof, or controlling the center points of the laser beams to move in a transverse path and a longitudinal path without overlapping the transverse path for forming a T-shaped groove, or controlling the center points of the laser beams to sequentially move in a first path, a curve path, and a second path substantially perpendicular to the first path for forming a curve groove.

10 Claims, 8 Drawing Sheets

(56) References Cited

U.S. PATENT DOCUMENTS

| | | | | |
|---|---|---|---|---|
| 8,183,067 B2* | 5/2012 | Yamazaki | ........... | H01L 27/1214 |
| | | | | 438/29 |
| 8,227,353 B2* | 7/2012 | Omata | ............... | B23K 26/0676 |
| | | | | 430/311 |

* cited by examiner

LASER ETCHING METHOD FOR TRANSPARENT CONDUCTIVE PLATE AND TRANSPARENT CONDUCTIVE PLATE PREPARED THEREBY

BACKGROUND OF THE INVENTION

1. Field of the Invention

The instant invention relates to an etching method; in particular, to a laser etching method for a transparent conductive plate and a transparent conductive plate prepared thereby.

2. Description of Related Art

Panel displays and the solar energy are currently the focus of the corresponding industry, and the transparent conductive layer made by indium tin oxide (ITO) is often applied to the touch panel, the panel display, the antistatic film, the transparent electrode of solar cell, the anti-reflective coating, and the heat reflecting mirror. The conventional ITO conductive layer is coated on a plastic substrate to be one element of the flexible touch panel. The ITO conductive layer has a plurality of advantages, such as thin, impact resistance, flexible, and the other characteristics, so that the ITO conductive layer may totally replace the conductive glass in the technical fields of flexible display and solar panel.

The conventional ITO conductive layer is a combination of tin oxide and indium oxide, and the proportion of tin oxide and indium oxide is 1:9. At present, the lithography manner is used to form the electrode pattern of the ITO conductive layer. The lithography manner is complex and time-consuming, and the lithography manner tends to chemically contaminates the surface of the ITO conductive layer. Accordingly, the laser etching manner has been applied to the ITO conductive layer. The laser etching manner is a dry process, and the laser etching manner not only reduces the equipment costs, but also improves the process efficiency. Moreover, unlike the ITO conductive layer that is made by coating the above-mentioned inorganic metal layer, an organic transparent conductive layer can also be made and has been used in recent years. The above-described organic transparent conductive layer has good electrical properties, such as low impedance, the thickness less than 100 nm, and the light transmittance higher than 85%. Additionally, after the laser etching process, the residues of the organic transparent conductive layer can be reduced, which makes it easy to clean.

However, some particular etching paths can still easily lead to insufficient or excessive etching problem for either the ITO conductive layer or the organic transparent conductive layer. To achieve the abovementioned improvement, the inventors strive via industrial experience and academic research to present the instant disclosure, which can provide additional improvement as mentioned above.

SUMMARY OF THE INVENTION

The instant disclosure provides a laser etching method for a transparent conductive plate and a transparent conductive plate prepared by the transparent conductive plate, thereby effectively improving insufficient or excessive etching, which is easily generated in some particular etching paths when etching a conductive layer by laser beams.

The instant disclosure provides a laser etching method for a transparent conductive plate, comprising: providing a transparent conductive plate, wherein the transparent conductive plate has a transparent insulating substrate and a transparent conductive layer formed on the insulating substrate; defining a predetermined etching path on the conductive layer, wherein the predetermined etching path has at least one of a predetermined end connection path, a predetermined T-shaped path, and a predetermined right angle path; and emitting a plurality of laser beams at a sustain manner from a laser apparatus onto the conductive layer of the transparent conductive plate, and controlling the center points of the laser beams onto the conductive layer in part of the predetermined etching path; wherein when etching the conductive layer corresponding to the predetermined end connection path, controlling the center points of the laser beams to move in a front path and a rear path partially overlapping a beginning portion of the front path, thereby forming an end connection groove on the transparent conductive plate, wherein when etching the conductive layer corresponding to the predetermined T-shaped path, controlling the center points of the laser beams to move in a transverse path and a longitudinal path without overlapping the transverse path, thereby forming a T-shaped groove on the transparent conductive plate, and wherein when etching the conductive layer corresponding to the predetermined right angle path, controlling the center points of the laser beams to sequentially move in a first path, a curve path, and a second path substantially perpendicular to the first path, thereby forming a curve groove on the transparent conductive plate.

The instant disclosure also provides a transparent conductive plate is prepared by the above laser etching method.

In summary, the laser etching method and the transparent conductive plate prepared by the laser etching method of the instant disclosure are provided with adjusting the predetermined end connection path, the predetermined T-shaped path, and the predetermined right angle path by controlling the movement of the laser apparatus, thereby improving the insufficient or excessive etching problem.

In order to further appreciate the characteristics and technical contents of the instant invention, references are hereunder made to the detailed descriptions and appended drawings in connection with the instant invention. However, the appended drawings are merely shown for exemplary purposes, rather than being used to restrict the scope of the instant invention.

DETAILED DESCRIPTION OF THE PREFERRED EMBODIMENTS

Please refer to FIGS. 1 through 4D, which show an embodiment of the instant disclosure. References are hereunder made to the detailed descriptions and appended drawings in connection with the instant invention. However, the appended drawings are merely shown for exemplary purposes, rather than being used to restrict the scope of the instant invention.

The instant embodiment provides a laser etching method for a transparent conductive plate. In order to clearly understand the instant disclosure, the etching paths are shown in the figures for example, but the etching paths are not limited thereto. Moreover, when refer to the figure corresponding to each step, please refer to the other figures if necessary. The laser etching method of the instant disclosure includes the steps as follows.

Figure 1:
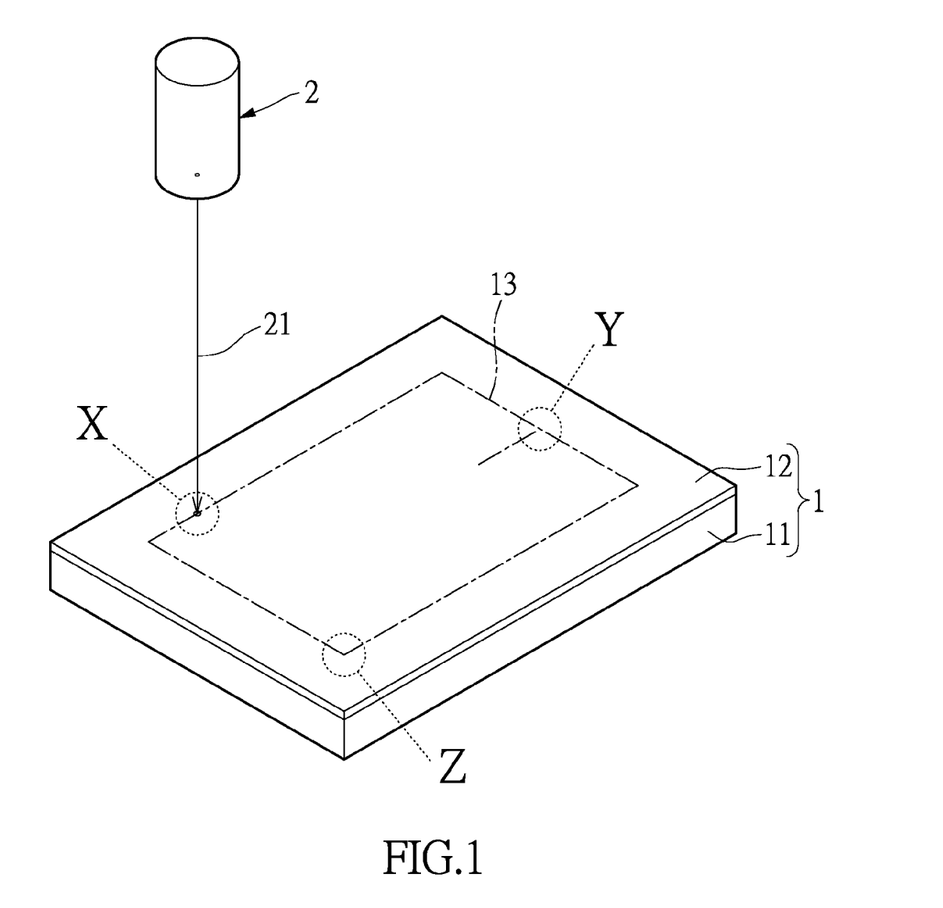
FIG. 1 is a perspective view showing a laser etching method for a transparent conductive plate according to the instant disclosure.

Step S110: please refer to FIG. 1. A transparent conductive plate 1 is provided, and the transparent conductive plate 1 includes a transparent insulating substrate 11 and a transparent conductive layer 12 formed on the insulating substrate 11.

The insulating substrate 11 in the instant embodiment is a polymethylmethacrylate (PMMA) substrate, a polycarbonate (PC) substrate, a polyamide (PA) substrate, a polyethylene terephthalate (PET) substrate, or a glass substrate, but the insulating substrate 11 is not limited thereto.

The conductive layer 12 in the instant embodiment is prepared by coating a modulation solution to the insulating substrate 11, and the modulation solution includes Poly(3,4-ethylenedioxythiophene)/Polystyrene sulfonate (PEDOT/PSS). Moreover, the conductive layer 12 can have a plurality of carbon nanotubes or a plurality of silver nanowires, the length of each carbon nanotube is smaller than 10 μm, the diameter of each silver nanowire is smaller than 500 nm, and the weight percentage of the carbon nanotubes or the silver nanowires with respect to the conductive layer 12 is smaller than or equal to 10%. Additionally, the thickness of the conductive layer 12 is preferably smaller than 500 nm.

Step S130: please refer to FIG. 1. A predetermined etching path 13 is defined on the conductive layer 12, and the predetermined etching path 13 has at least one of following a predetermined end connection path (i.e., part of the predetermined etching path 13 arranged in the X area as shown in FIG. 1), a predetermined T-shaped path (i.e., part of the predetermined etching path 13 arranged in the Y area as shown in FIG. 1), and a predetermined right angle path (i.e., part of the predetermined etching path 13 arranged in the Z area as shown in FIG. 1). The predetermined etching path 13 in the instant embodiment has the predetermined end connection path, the predetermined T-shaped path, and the predetermined right angle path, but the predetermined etching path 13 is not limited thereto.

It should be noted that when etching the predetermined end connection path, the predetermined T-shaped path, or the predetermined right angle path by laser beams in the past, the laser beams generated from a laser apparatus that completes the entire predetermined end connection path in one step, the entire predetermined T-shaped path, or the entire predetermined right angle path, thereby easily under or over etch. The reasons for the insufficient or excessive etching are as follows.

If the laser beams completes the entire predetermined end connection path, the initial or final laser beams emitted from the laser apparatus are unstable, either energy is too low or too high, so that insufficient or excessive etching easily occurs at a beginning portion or a final portion of the predetermined end connection path.

If the laser beams completes the entire predetermined T-shaped path, a cross point of the T-shaped path is etched by the laser beams more than the other portion because the etching area of each laser beam is a plane not a point, so excessive etching easily occurs at the cross point of the predetermined T-shaped path, which can generate a lot of bright spots.

If the laser beams completes the entire predetermined right angle path, a right angle corner portion of the predetermined right angle path is more frequently etched by the laser beams than the other portion because the etching areas of the laser beams overlaps more frequently at the right angle corner portion, so excessive etching easily occurs at the right angle corner portion of the predetermined right angle path, which can generate a lot of bright spots.

Step S150: please refer to FIG. 1. A laser apparatus 2 emits a plurality of laser beams 21 at a sustain manner onto the conductive layer 12 of the transparent conductive plate 1, and the center points of the laser beams 21 onto the conductive layer 12 are controlled to move in part of the predetermined etching path 13. Specifically, when etching the conductive layer 12 corresponding to the predetermined end connection path, the predetermined T-shaped path, or the predetermined right angle path, the center points of the laser beams 21 do not complete the entire predetermined etching path 13. When etching the conductive layer 12 that corresponds to the predetermined end connection path, the predetermined T-shaped path, or the predetermined right angle path, the movement of the center points of the laser beams 21 is adjusted as follows.

Figure 2A:
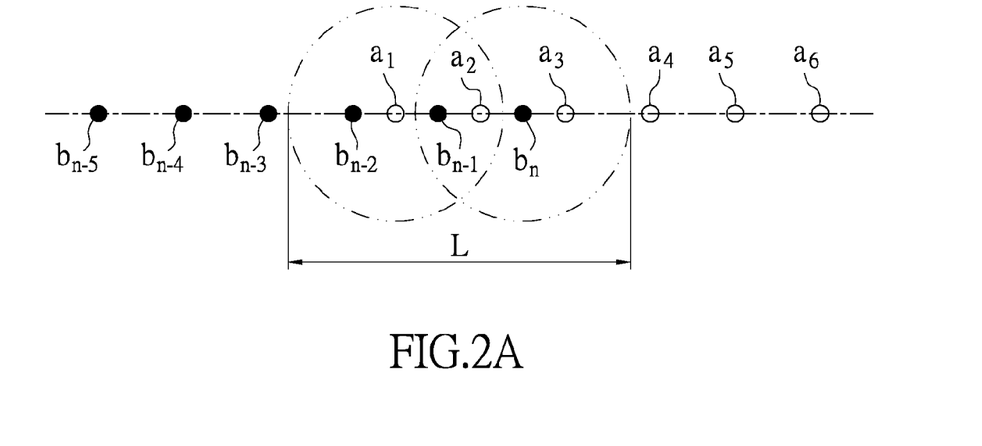
FIG. 2A is a perspective view showing the etching path in the X area of FIG. 1.
Figure 2B:
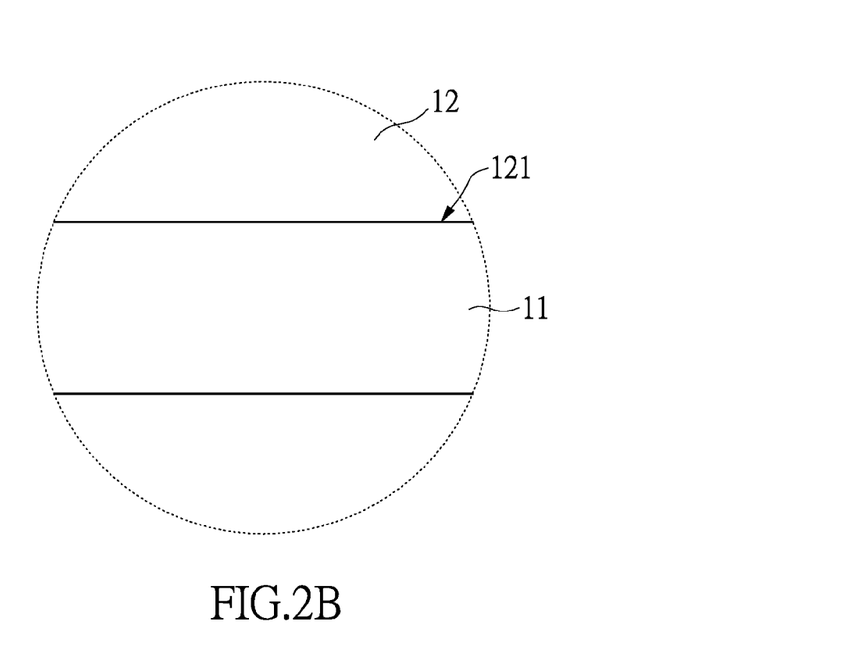
FIG. 2B is an enlarged view showing the X area of the transparent conductive plate after etching in the etching path by the laser beams as shown in FIG. 2A.

Step S151: please refer to FIGS. 2A and 2B. When etching the conductive layer 12 that corresponds to the predetermined end connection path, the center points $a_1 \sim a_6$, $b_{n-5} \sim b_n$ of the laser beams 21 are controlled to move in a front path and a rear path partially overlapping a beginning portion of the front path, thus forming an end connection groove 121.

As shown in FIG. 2A, the front path is a path from the center point $a_1$ to the center point $a_6$, that is to say, the center points $a_1 \sim a_6$ of the laser beams 21 are controlled to move in the front path. The beginning portion of the front path as shown in FIG. 2A is the portion of the front path between the center point $a_1$ and the center point $a_2$.

Moreover, as shown in FIG. 2A, the rear path is a path from the center point $b_{n-5}$ to the center point $b_n$, that is to say, the center points $b_{n-5} \sim b_n$ of the laser beams 21 are controlled to move in the rear path. An overlapping length L of the front path and the rear path as shown in FIG. 2A is a distance of a double etching region, and the double etching region is located between the etching area of the laser beam 21 corresponding to the center point $a_1$ (i.e., the circular imaginary line at the left side as shown in FIG. 2A) and the etching area of the laser beam 21 corresponding to the center point $b_n$ (i.e., the circular imaginary line at the right side as shown in FIG. 2A).

Specifically, the overlapping length L of the front path and the rear path is 5~20 μm, particularly to 5~10 μm, but the overlapping length L is not limited thereto.

In summary, the front path and the rear path need to have the overlapping length L of a specific value, which is obviously different from the predetermined end connection path, thus insufficient or excessive etching occurs in the predetermined end connection path can be effectively improved.

Figure 3A:
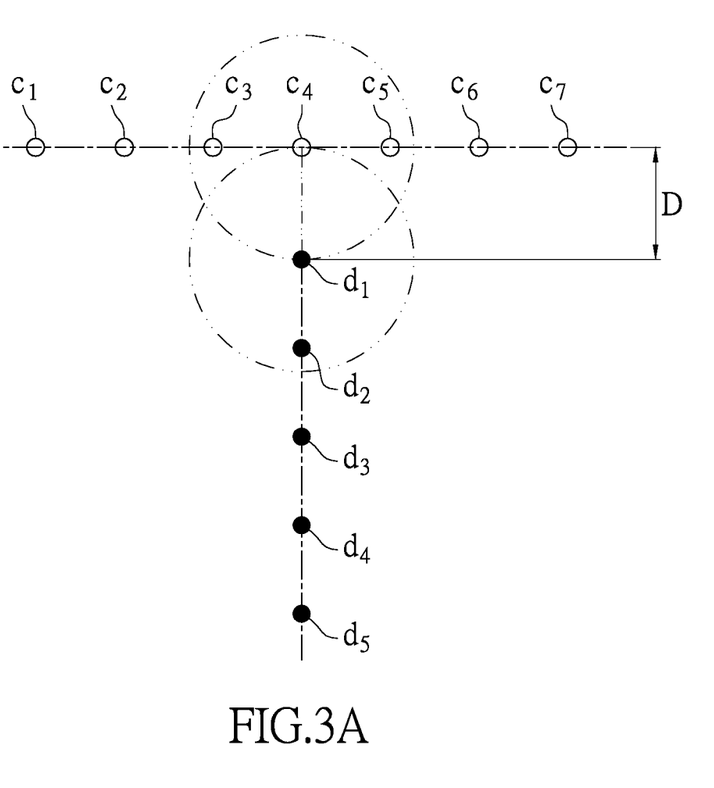
FIG. 3A is a perspective view showing the etching path in the Y area of FIG. 1.
Figure 3B:
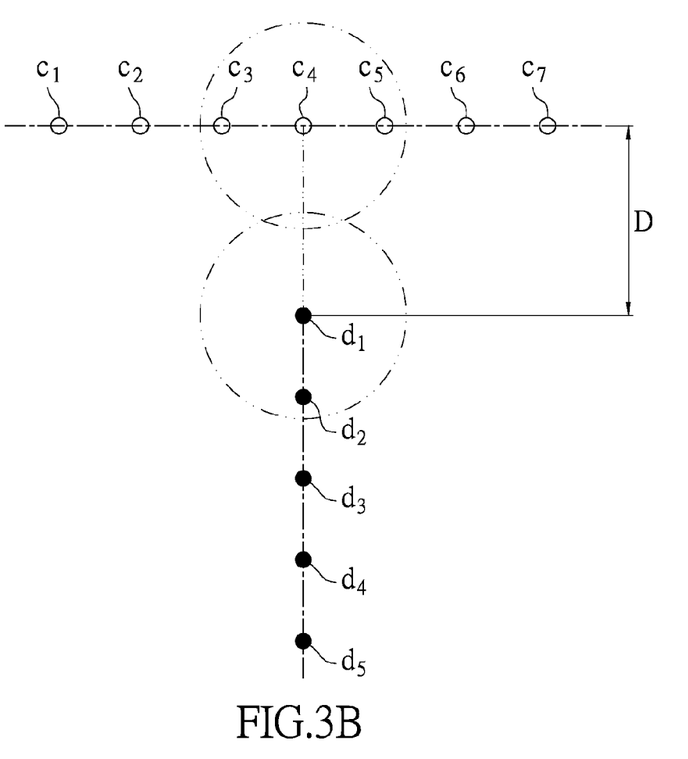
FIG. 3B is a perspective view showing another kind of the etching path in the Y area of FIG. 1.
Figure 3C:
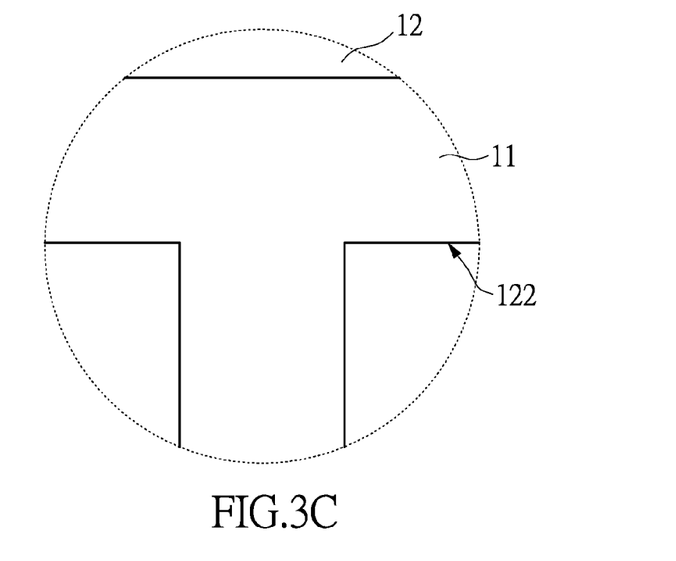
FIG. 3C is an enlarged view showing the Y area of the transparent conductive plate after etching in the etching path by the laser beams as shown in FIG. 3A or 3B.

Step S152: please refer to FIGS. 3A through 3C. When etching the conductive layer 12 that corresponds to the predetermined T-shaped path, the center points $c_1$~$c_7$, $d_1$~$d_5$ of the laser beams 21 are controlled to move in a transverse path and a longitudinal path without overlapping the transverse path, thus forming a T-shaped groove 122.

As shown in FIG. 3A or 3B, the transverse path is a path from the center point $c_1$ to the center point $c_7$, that is to say, the center points $c_1$~$c_7$ of the laser beams 21 are controlled to move in the transverse path. The longitudinal path is a path from the center point $d_1$ to the center point $d_5$, that is to say, the center points $d_1$~$d_5$ of the laser beams 21 are controlled to move in the longitudinal path. Moreover, the center point $d_1$ of the laser beam 21 in the instant embodiment is regarded as a starting point of the longitudinal path, but the center point $d_1$ of the laser beam 21 can be regarded as an end point of the longitudinal path.

Specifically, a shortest distance D between the transverse path and the longitudinal path as shown in FIGS. 3A or 3B is a distance between the center point $d_1$ and the transverse path. However, in order to avoid excessive etching, the shortest distance D between the transverse path and the longitudinal path is preferably larger than a radius of the etching area of each laser beam 21 (as shown in FIG. 3A). Moreover, in order to form a cross point of the T-shaped groove 122, the shortest distance D between the transverse path and the longitudinal path is preferably smaller than a diameter of the etching area of each laser beam 21 (as shown in FIG. 3B).

In summary, the transverse path and the longitudinal path need to have a specific spacing (i.e., the shortest distance D), which is obviously different from the predetermined T-shaped path, thus excessive etching in the predetermined T-shaped path can be effectively improved.

Step S153: please refer to FIGS. 4A through 4D. When etching the conductive layer 12 that corresponds to the predetermined right angle path, the center points $e_{n-4}$~$e_n$, $f_1$~$f_8$, $g_1$~$g_5$ of the laser beams 21 are controlled to sequentially move in a first path, a curve path, and a second path substantially perpendicular to the first path, thus forming a curve groove 123.

Figure 4A:
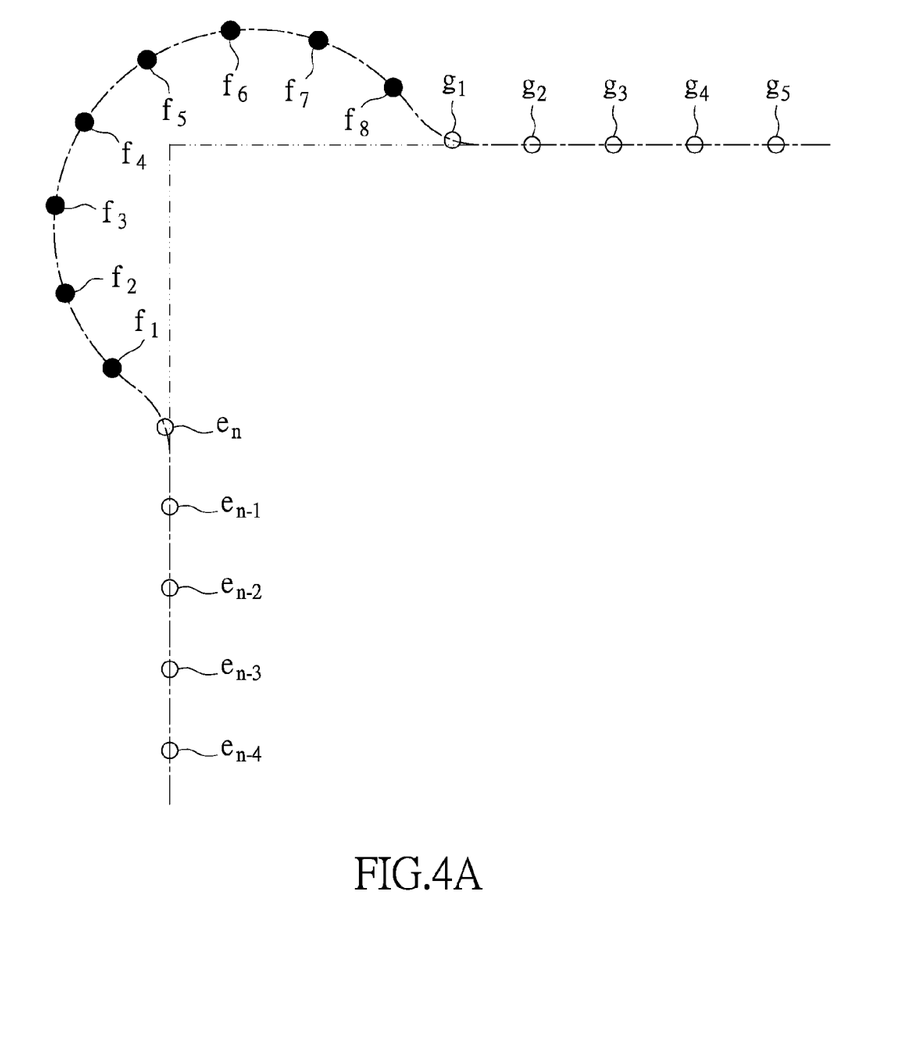
FIG. 4A is a perspective view showing the etching path in the Z area of FIG. 1.
Figure 4B:
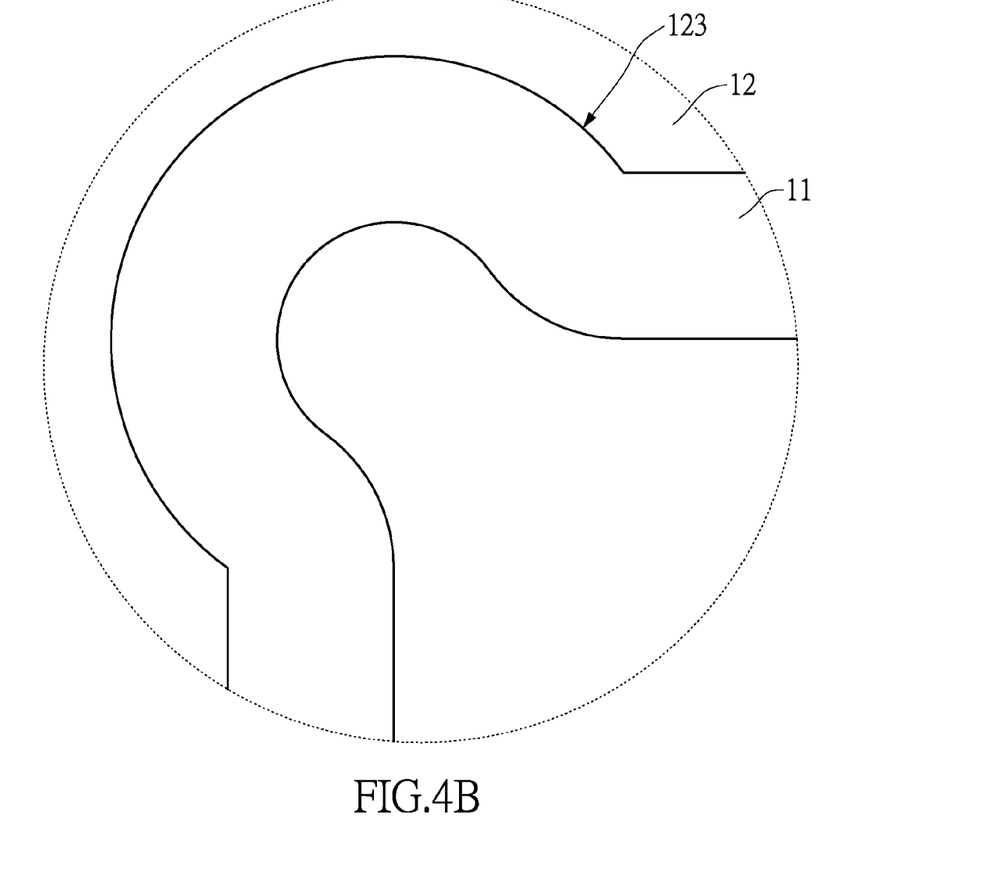
FIG. 4B is an enlarged view showing the Z area of the transparent conductive plate after etching in the etching path by the laser beams as shown in FIG. 4A.
Figure 4C:
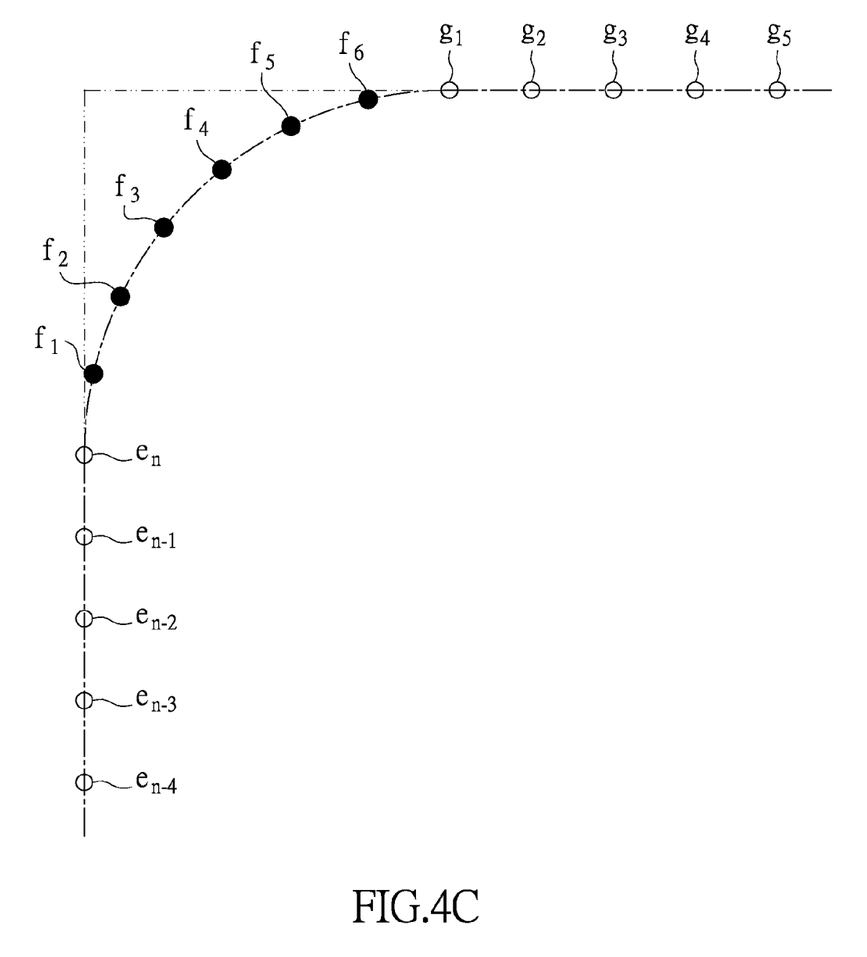
FIG. 4C is a perspective view showing another kind of the etching path in the Z area of FIG. 1.
Figure 4D:
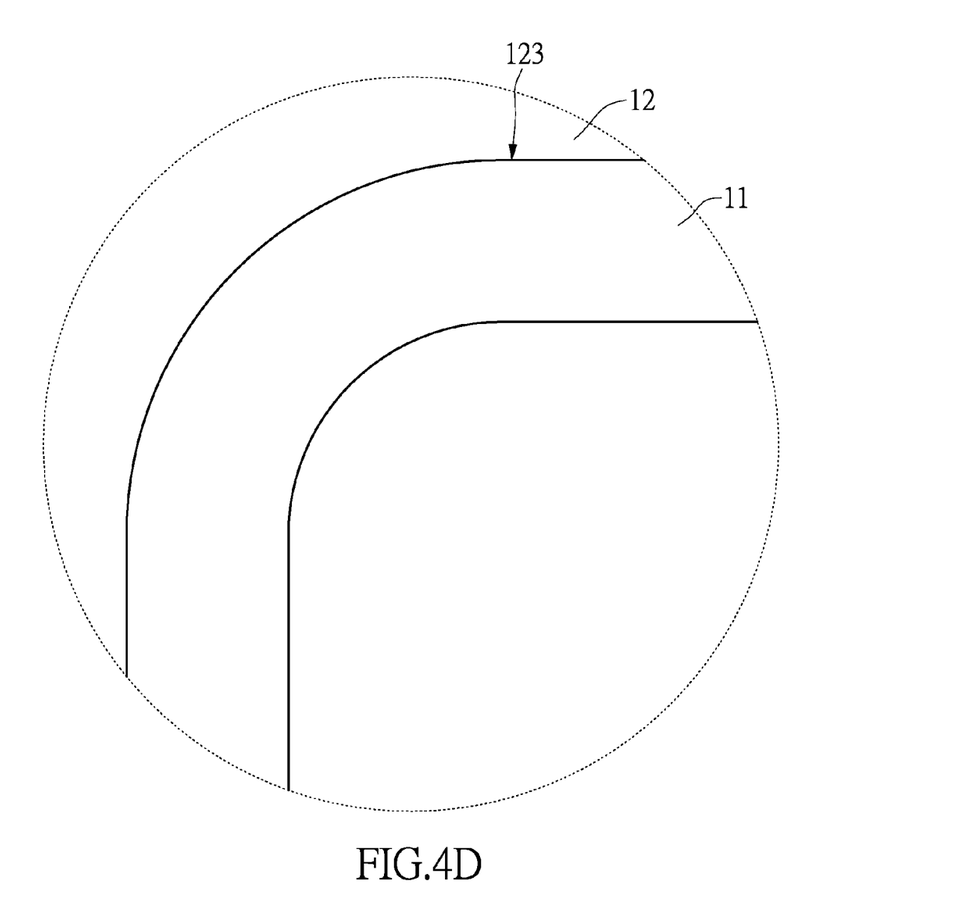
FIG. 4D is an enlarged view showing the Z area of the transparent conductive plate after etching in the etching path by the laser beams as shown in FIG. 4C.

As shown in FIG. 4A or 4C, the first path is a path from the center point $e_{n-4}$ to the center point $e_n$, that is to say, the center points $e_{n-4}$~$e_n$ of the laser beams 21 are controlled to move in the first path. The second path is a path from the center point $g_1$ to the center point $g_5$, that is to say, the center points $g_1$∥$g_5$ of the laser beams 21 are controlled to move in the second path.

As shown in FIG. 4A, the curve path is a path from the center point $f_1$ to the center point $f_8$, that is to say, the center points $f_1$~$f_8$ of the laser beams 21 are controlled to move in the curve path around the outer side of the right angle corner of the predetermined right angle path. Moreover, as shown in FIG. 4C, the curve path can also be a path from the center point $f_1$ to the center point $f_6$, that is to say, the center points $f_1$~$f_6$ of the laser beams 21 are controlled to move in the curve path around the inner side of the right angle corner of the predetermined right angle path.

In summary, the curve path is obviously different from the predetermined right angle path, thus excessive etching in the predetermined right angle path can be effectively improved by controlling the laser beams 21 to move in a non-right angle path (i.e., the curve path). Moreover, although the shape of the curve groove 123 is different from the predetermined right angle path, the user cannot see the shape of curve groove 123 because the conductive layer 12 is transparent.

Specifically, according to the material of the conductive layer 12 in the step S110, the parameters of the laser apparatus 2 can be adjusted in the step S150 for better etching effect. The parameters of the laser apparatus 2 are disclosed as follows.

When the conductive layer 12 is a PEDOT conductive layer, the laser apparatus 2 is provided to emit infrared laser beams 21 of about 1064±20 nm since the optical property of the PEDOT conductive layer tends to be blue. When the laser apparatus 2 emits the laser beams 21 at a sustained manner onto the conductive layer 12 of the transparent conductive plate 1, the energy of each laser beam 21 is 1~5 W.

Moreover, a pulse duration time (PDT) of the laser beams 21 of the laser apparatus 2 is adjusted to 1~500 ns, a pulse repetition rate (PRR) of the laser beams 21 of the laser apparatus 2 is 50~500 kHz, and a moving rate of the laser apparatus 2 is 800~4000 mm/s. Accordingly, when controlling the center points of the laser beams 21 onto the conductive layer 12, an area defined by emitting one of the laser beams 21 onto the conductive layer 12 partially overlaps the areas defined by emitting a bundle of 3~16 adjacent laser beams 21 onto the conductive layer 12 (not shown in the figures). Besides, the instant embodiment also provides a transparent conductive plate 1 prepared by the above laser etching method.

Additionally, in order to prove the above laser etching method can improve the etching problems generated from the conventional laser etching method, the instant disclosure shows the embodiments 1~11 in chart 1 and the comparative examples 1~6 in chart 2 to confirm that the transparent conductive plate 1 prepared by the above laser etching method has better effect.

It should be noted that the conductive layer 12 in the instant embodiment is the PEDOT conductive layer, but the conductive layer 12 can be an ITO conductive layer (not shown in the embodiments). In other words, when the conductive layer 12 is the ITO conductive layer, the etching problems of the ITO conductive layer can also be improved by the above laser etching method disclosed in the instant embodiment, thereby reducing the number of the bright spot of the ITO conductive layer.

Based on the embodiments 1~3 in the chart 1, 1~5 W is a suitable choice for the energy of each laser beam 21 emitted from the laser apparatus 2, and 2~4 W is better than 1~5 W. Based on embodiments 4 and 5 in chart 1, 50~500 kHz is a suitable choice for the PRR of the laser beams 21 of the laser apparatus 2, and 200~400 kHz is more preferable than 50~500 kHz. Moreover, 800~4000 mm/s is a suitable choice for the moving rate of the laser apparatus 2, and 1800~2500 mm/s is more preferable than 800~4000 mm/s. Comparing the embodiment 6 in chart 1 and the comparative example 5 in chart 2, the comparative example 5 is implemented by etching along the predetermined right angle path, embodiment 6 is implemented by etching along the curved path, and embodiment 6 can improve upon the excessive etching by reducing the number of bright spot. Based on embodiments 7 and 8 in chart 1, the carbon nanotubes or the silver nanowires are suitable to add in the conductive layer 12. Based on embodiments 9 to 11 in chart 1, PMMA substrate, glass substrate, and harden PET substrate are all suitable to apply as the insulating substrate 11.

In summary, embodiments 1-11 in chart 1 can prove that the etched traces of the conductive plate 1 are not obvious, the etching region of the conductive plate 1 does not have residue, and the short/open circuit between two adjacent conductive lines of the conductive plate 1 is lower than 10%. Moreover, the number of bright spot of the conductive plate 1 can be controlled to be lower than 5 point/10 cm$^2$, and the etching edges of the conductive plate 1 are smooth.

Additionally, based on the comparative example 1 in chart 2, the ITO conductive layer has residue and cannot be etched completely when etched by laser beams. Based on the comparative example 2 in chart 2, when the energy of each laser beam emitted from the laser apparatus is too large, excessive etching easily occurs on the insulating substrate that raises the transmittance of the etched portion, such that the insulating substrate is formed with a lot of bright spots. Based on the comparative example 3 in chart 2, when the PRR of the laser beams of the laser apparatus is too low, the etched portion of the conductive layer is not easily observed by naked eyes, but the etched portion of the conductive layer has irregular edges and serrated edges when observed under an optical microscope, and part of the conductive layer is not completely etched to cause short/open circuit, which can reach up to 20%. Based on the comparative example 4 in chart 2, when the PRR of the laser beams of the laser apparatus is too high, the transparent conductive plate has obvious etched traces and a lot of bright spots, thus affecting the appearance of the transparent conductive plate. Based on the comparative example 6 in chart 2, when the laser beams move entirely in the predetermined T-shaped path, a lot of bright spots easily form on the cross point of the predetermined T-shaped path.

| item | parameter | unit | Embodiment 1 | Embodiment 2 | Embodiment 3 | Embodiment 4 | Embodiment 5 | Embodiment 6 |
|---|---|---|---|---|---|---|---|---|
| material | Conductive layer | | PEDOT | PEDOT | PEDOT | PEDOT | PEDOT | PEDOT |
| | substrate | | PET | PET | PET | PET | PET | PET |
| condition of laser beam | diameter | um | 25 | 25 | 25 | 25 | 25 | 25 |
| | wavelength | nm | 1064 | 1064 | 1064 | 1064 | 1064 | 1064 |
| | energy | W | 1 | 5 | 3 | 3 | 3 | 3 |
| | PDT | ns | 100 | 100 | 100 | 100 | 100 | 100 |
| | PRR | kHz | 280 | 280 | 280 | 200 | 500 | 280 |
| | rate | mm/sec | 2000 | 2000 | 2000 | 2500 | 1800 | 2000 |
| etched result | width | 20 um | 23 ± 3 | 22 ± 3 | 25 ± 2 | 25 ± 5 | 26 ± 2 | 25 ± 3 |
| | bright spot | number/10 cm$^2$ | 0 | 2 | 0 | 0 | 1 | 0 |
| | etched edge | linear regression ($R^2$) | 0.975 | 0.999 | 0.997 | 0.981 | 0.999 | 0.988 |
| | appearance by naked eyes | | smoothness | smoothness | smoothness | smoothness | smoothness | smoothness |
| | residue | number/10 cm$_2$ | 0 | 0 | 0 | 0 | 0 | 0 |
| | Short/open circuit | number/hundred plates | 8 | 1 | 3 | 7 | 2 | 3 |

| item | parameter | unit | Embodiment 7 | Embodiment 8 | Embodiment 9 | Embodiment 10 | Embodiment 10 |
|---|---|---|---|---|---|---|---|
| material | Conductive layer | | PEDOT + carbon nanotubes | PEDOT + silver nanowires | PEDOT | PEDOT | PEDOT |
| | substrate | | PET | PET | PMMA | glass | harden PET |
| condition of laser beam | diameter | um | 25 | 25 | 25 | 25 | 25 |
| | wavelength | nm | 1064 | 1064 | 1064 | 1064 | 1064 |
| | energy | W | 3 | 3 | 3 | 3 | 3 |
| | PDT | ns | 100 | 100 | 100 | 100 | 100 |
| | PRR | kHz | 280 | 280 | 280 | 280 | 280 |
| | rate | mm/sec | 2000 | 2000 | 2000 | 2000 | 2000 |
| etched result | width | 20 um | 26 ± 2 | 25 ± 3 | 26 ± 2 | 26 ± 2 | 25 ± 2 |
| | bright spot | number/10 cm$^2$ | 0 | 0 | 0 | 0 | 0 |
| | etched edge | linear regression ($R^2$) | 0.997 | 0.995 | 0.993 | 0.997 | 0.996 |
| | appearance by naked eyes | | smoothness | smoothness | smoothness | smoothness | smoothness |
| | residue | number/10 cm$_2$ | 0 | 0 | 0 | 0 | 0 |
| | Short/open circuit | number/hundred plates | 4 | 5 | 3 | 4 | 3 |

-continued

| | parameter | unit | Example 1 | Example 2 | Example 3 | Example 4 | Example 5 | Example 6 |
|---|---|---|---|---|---|---|---|---|
| material | Conductive layer | um | ITO | PEDOT | PEDOT | PEDOT | PEDOT | PEDOT |
| | substrate | nm | PET | PET | PET | PET | PET | PET |
| condition of laser beam | diameter | um | 25 | 25 | 25 | 25 | 25 | 25 |
| | wavelength | nm | 1064 | 1064 | 1064 | 1064 | 1064 | 1064 |
| | energy | W | 3 | 10 | 3 | 3 | 3 | 3 |
| | PDT | ns | 100 | 100 | 100 | 100 | 100 | 100 |
| | PRR | kHz | 280 | 280 | 120 | 800 | 280 | 280 |
| | rate | mm/sec | 2000 | 2000 | 3000 | 1500 | 2000 | 2000 |
| etched result | width | 20 um | 22 ± 5 | 28 ± 2 | 23 ± 7 | 27 ± 2 | >30 | >30 |
| | bright spot | number/10 cm$^2$ | 0 | 12 | 0 | 15 | gather at corner | gather at cross point |
| | etched edge | linear regression ($R^2$) | 0.965 | 0.991 | 0.954 | 0.993 | ~ | ~ |
| | appearance by naked eyes | | irregular | high transmittance | smoothness | high transmittance | bright spot gather at corner | bright spot gather at cross point |
| | residue | number/10 cm$^2$ | >20 | 0 | a lot | 0 | 0 | 0 |
| | short/open circuit | number/100 plates | >50 | 1 | >20 | 1 | ~ | ~ |

[The Possible Effect of the Instant Disclosure]

In summary, the laser etching method and the transparent conductive plate prepared by the laser etching method of the instant disclosure are provided along with adjustments to the predetermined end connection path, the predetermined T-shaped path, and the predetermined right angle path. The adjustments being movement control of the laser apparatus, thereby improving insufficient or excessive etching Moreover, the laser etching method of the instant disclosure is preferably provided for the PEDOT conductive layer, thereby improving the manufacturing process efficiency and surface quality so as to provide excellent laser etching effect.

The descriptions illustrated supra set forth simply the preferred embodiments of the instant invention; however, the characteristics of the instant invention are by no means restricted thereto. All changes, alternations, or modifications conveniently considered by those skilled in the art are deemed to be encompassed within the scope of the instant invention delineated by the following claims.

What is claimed is:

1. A laser etching method for a transparent conductive plate, comprising:
   providing a transparent conductive plate, wherein the transparent conductive plate has a transparent insulating substrate and a transparent conductive layer formed on the insulating substrate;
   defining a predetermined etching path on the conductive layer, wherein the predetermined etching path has at least a predetermined end connection path, a predetermined T-shaped path, or a predetermined right angle path; and
   emitting a plurality of laser beams at a sustained manner from a laser apparatus onto the conductive layer of the transparent conductive plate, and controlling the center points of the laser beams onto the conductive layer in part of the predetermined etching path;
   wherein when etching the conductive layer corresponding to the predetermined end connection path, controlling the center points of the laser beams to move in a front path and a rear path partially overlapping a beginning portion of the front path, thereby forming an end connection groove on the transparent conductive plate,
   wherein when etching the conductive layer corresponding to the predetermined T-shaped path, controlling the center points of the laser beams to move in a transverse path and a longitudinal path without overlapping the transverse path, thereby forming a T-shaped groove on the transparent conductive plate, and
   wherein when etching the conductive layer corresponding to the predetermined right angle path, controlling the center points of the laser beams to sequentially move in a first path, a curve path, and a second path substantially perpendicular to the first path, thereby forming a curve groove on the transparent conductive plate.

2. The laser etching method as claimed in claim 1, wherein when controlling the center points of the laser beams onto the conductive layer in part of the predetermined etching path, an area defined by emitting one of the laser beams onto the conductive layer partially overlaps the areas defined by emitting 3 to 16 adjacent laser beams onto the conductive layer.

3. The laser etching method as claimed in claim 1, wherein the laser beams of the laser apparatus has a pulse duration of 1 to 500 ns.

4. The laser etching method as claimed in claim 1, wherein when etching the conductive layer corresponding to the predetermined end connection path, the front path and the rear path each have an overlapping length of is 5 to 20 μm.

5. The laser etching method as claimed in claim 1, wherein when providing the transparent conductive plate, the conductive layer is prepared by coating a modulation solution on the insulating substrate, and the modulation solution includes Poly(3,4-ethylenedioxythiophene)Polystyrene sulfonate.

6. The laser etching method as claimed in claim 5, wherein when emitting the laser beams at a sustained manner from the laser apparatus onto the conductive layer of the transparent conductive plate, each laser beam has an energy of 1~5 W, the laser beams of the laser apparatus has a pulse repetition rate of 50~500 kHz, and the laser apparatus has a moving rate of 800~4000 mm/s.

7. The laser etching method as claimed in claim 6, wherein the insulating substrate is a Poly (methyl methacrylate substrate, a PC substrate, a PA substrate, a PET substrate, or a glass substrate.

8. The laser etching method as claimed in claim 6, wherein the conductive layer has a plurality of carbon nanotubes or a plurality of silver nanowires, the length of each carbon nanotube is smaller than 10 µm, the diameter of each silver nanowire is smaller than 500 nm, and the weight percentage of the carbon nanotubes or the silver nanowires with respect to the conductive layer is smaller than or equal to 10%.

9. The laser etching method as claimed in claim 6, wherein a thickness of the conductive layer is smaller than 500 nm.

10. A transparent conductive plate is prepared by the laser etching method as claimed in claim 1.

* * * * *